United States Patent [19]
Ikeda

[11] Patent Number: 5,840,445
[45] Date of Patent: Nov. 24, 1998

[54] METHOD OF MANUFACTURING A SELF-ALIGNED PHASE-SHIFTING MASK

[75] Inventor: Rikio Ikeda, Kanagawa, Japan

[73] Assignee: Sony Corporation, Tokyo, Japan

[21] Appl. No.: 873,150

[22] Filed: Apr. 24, 1992

[30] Foreign Application Priority Data

Apr. 26, 1991 [JP] Japan ................................. 3-125363

[51] Int. Cl.⁶ ........................................................ G03F 9/00
[52] U.S. Cl. ............................................................. 430/5
[58] Field of Search ................................................... 430/5

[56] References Cited

U.S. PATENT DOCUMENTS 5,045,417  9/1991  Okamoto ..................................... 430/5

FOREIGN PATENT DOCUMENTS 0 090 924  10/1983  European Pat. Off. .
58-173744  10/1983  Japan .
62-50811   10/1987  Japan .

OTHER PUBLICATIONS

Levenson et al, "Improving Resolution in Photolithography with a Phase–Shifting Mask", *IEEE Transactions on Electron Devices*, vol. ED–29, No. 12, Dec. 1982, pp. 1828–1836.

Levenson et al, "The Phase–Shifting Mask II: Imaging Simulations and Submicrometer Resist Exposures", *IEEE Transactions on Electron Devices*, vol. ED–31, No. 6, Jun. 1984, pp. 753–763.

Nitayama et al, "New Phase Shifting Mask with Self–aligned Phase Shifters for a Quarter Micron Photolithography", *IEDM*, 1989, pp. 57–60.

Abstract No. 28a–PD–2, *Extended Abstracts* (*The 37th Spring Meeting, 1990*); The Japan Society of Applied Physics and Related Societies, No. 2.

*Primary Examiner*—Mark Chapman
*Attorney, Agent, or Firm*—Hill & Simpson

[57] ABSTRACT

A phase-shifting mask having a light shielding portion, a light permeation portion and a phase-shifting portion on a transparent substrate is manufactured by forming a negative resist layer to the entire surface on a transparent substrate formed with a light shielding material pattern, applying exposure from the rearface of the transparent substrate, followed by applying development to leave the negative resist layer on the light permeation portion, then further continuing development for the negative resist layer to reduce the width and form a sub-space between the negative resist layer and the light shielding portion, to obtain a phase-shifting portion easily and at a high accuracy. The phase-shifting portion can be formed by an easy and simple step under a good controllability free from of the problems of mask alignment between each other.

11 Claims, 16 Drawing Sheets

METHOD OF MANUFACTURING A SELF-ALIGNED PHASE-SHIFTING MASK

BACKGROUND OF THE INVENTION

1. Field of the Invention

The present invention concerns a method of manufacturing a phase-shifting mask. The present invention can be applied to a method of manufacturing a phase-shifting mask used, for example, in to a technique of forming various kinds of patterns and it can be utilized, for example, as a method of manufacturing a phase-shifting photomask used as a mask or the like in a case of forming a resist pattern in a semiconductor device manufacturing process.

2. Description of the Prior Art

In semiconductor device and like other products formed by utilizing photomasks, the fabrication dimension size has become finer year by year. In photolithography for obtaining refined semiconductor devices under such a background, a so-called phase-shifting technique of giving a phase difference to light transmitting through a mask thereby improving the profile of the light intensity has been highlighted in order to further improve the resolution power thereof.

Prior art phase-shifting technology has been disclosed, for example, in Japanese Patent Laid-Open Sho 58-173744, by Marc D. Levenson, et. al. in "Improving Resolution in Photolithography with a Phase-Shifting Mask" IEEE, Transaction On Electron Devices. Vol. ED-29, No. 12, December 1982, p 1828–1836 or by Marc D. Levenson, et. al. in "The Phase-Shifting Mask 11: Imaging Simulations and Submicrometer Resist Exposures", IEEE Transactions On Electron Devices Vol. ED-31, No. 6, June 1984, pp.753–763.

Further, Japanese Patent Publication Sho 62-50811 discloses a phase-shifting mask having a predetermined pattern comprising a light permeable portion and a light impermeable portions. A phase member is disposed in at least one of the permeable portions on both sides of the impermeable portion, to cause phase difference between the permeable portions on both sides.

Descriptions will be made to existent phase-shifting technique known so far with reference to FIG. 12. For instance, in a case of forming a line-and-space pattern, in a conventional mask, as shown in FIG. 12($a$), a light shielding portion 10 is formed by using a light shielding material such as chromium or other metals or metal oxides on a transparent substrate 1 such as a quartz substrate thereby forming a line-and-space repeating pattern to form an exposure mask. From a theoretical point of view, the intensity distribution of light transmitting or passing through the exposure mask, is 0 in the light shielding portion as shown by the curve reference A1 in FIG. 12($a$), or passing through the other portions (permeable portions 12$a$, 12$b$). Now considering one permeation portion 12$a$, the transmission light given to an exposed material forms a light intensity distribution having maximum peaks on both basis as shown at curve A2 in FIG. 12($a$). The transmission light curve A2' from the permeation portion 12$b$ is shown by a dotted chain. When lights from both of the permeation portions 12$a$ and 12$b$ are joined together or overlap sharpness of the light intensity distribution is lost as shown by curve A3, images are blurred due to the light diffraction and, after all, sharp exposure can not be attained. On the contrary, when a phase-shifting portion 11$a$ (referred to as a shifter made of material such as $SiO_2$ or resist) is disposed on every other light permeation portions 12$a$ and 12$a$ of the repeating pattern described above as shown in FIG. 12($b$), blurring of the images due to light diffraction is stopped by the inversion of the phase so that sharp images are created to improve the resolution power or the focal point margin. That is, as shown in FIG. 12($b$), when a phase-shifting portion 11$a$ is formed on the permeation portion 12$a$ on one side and if this gives a phase shifting, for example, of 180°, the light passing through the phase-shifting portion 11$a$ is inverted as shown by the reference curve B1. On the other hand, since the light from the permeation portion 12$b$ in adjacent therewith does not pass through the phase-shifting portion 11$a$ and, accordingly, undergoes no such inversion. Referring to the light given to the exposed member, lights inverted from each other are offset at the basis of the light intensity distribution to offset with each other at a position shown by B2 in the figure and, after all, the light distribution given to the exposed material has an identical sharp shape as shown at by curve B3 in FIG. 12($b$).

In the above-mentioned case, it is most advantageous to invert the phase by 180° for making the effect most reliable, and a phase-shifting portion 11$a$ formed with a membrane with a thickness D represented by the following equation is disposed:

$$D = \frac{\lambda}{2(n-1)}$$

in which n is a refractive index of the phase-shifting portion and $\lambda$ is a exposure wavelength.

In a case of forming a pattern by exposure, a member used for diminishing projection is referred to as a reticle, a member for 1:1 projection is referred to as a mask, a member corresponding to an original is referred to as a reticle or a copy prepared therefrom is referred as a mask. In the present invention, masks and reticles in such various meanings are collectively referred to as a mask.

Recently, in the phase-shifting technology as described above, a method as shown in FIG. 13 has been proposed as a technique capable of easily forming a phase shift membrane with a good resolution power and in an self-aligned manner (Nitayama, et al. IEDM Tec. Dig., 1989, 3-3, pp 57–60 or Pretext of Applied Physic Society, Spring Meeting 1990, 28a - PD-2).

In this technique, chromium on a substrate 1 is patterned by an EB resist pattern 20 to obtain a chromium pattern 10$b$ FIG. 13($a$)), the EB resist pattern 20 is properly eliminated, PMMA is coated as a photoresist also serving as a phase-shifting material to such a thickness as inverting the phase of the transmission light of the light used as the exposure light of the phase-shifting mask by 180° as shown in FIG. 13($b$) and then exposure is conducted by UV-rays from the rearface of the substrate 1 as shown by an arrow P in the figure. The PMMA layer is shown by the reference 11'. Thus, the chromium pattern 12 is transferred to PMMA and developed to obtain a structure having a PMMA pattern 11" shown in FIG. 13($c$). Subsequently, the chromium pattern 10$b$ is retracted by side etching to obtain a light shielding chromium portion as shown in FIG. 13($d$) thereby obtaining a phase-shifting mask structure using a portion of the PMMA pattern 11" in which the light shielding chromium portion 10$c$ is not present under the phase-shifting portion 11. In the figure, W is a width for the phase-shifting portion 11.

In accordance with the prior art described above, a self-aligned phase-shifting mask may be manufactured relatively simply. However, since the phase-shifting portion 11 is obtained by retracting the chromium pattern 10$b$ by etching, the width is determined by controlling the retraction but it is difficult to control the retraction preferably by etching. Further, the manufacturing step is still too complicate.

OBJECT OF THE INVENTION

An object of the present invention is to overcome the foregoing problems in the prior art and provide a method of manufacturing a novel self-aligned phase-shifting mask capable of obtaining a phase-shifting portion at a good controllability in a easy step and a phase-shifting portion is formed by way of a sub-space between light shielding material patterns independent of the light shielding portion, in a way different from the existent phase-shifting portion relative the light shielding portion.

SUMMARY OF THE INVENTION

In accordance with a first feature of the present invention, there is provided a method of manufacturing a phase-shifting mask having a light shielding portion, a light permeation portion and a phase-shifting portion on a transparent substrate, wherein the method comprises forming a negative resist layer on the entire surface of the transparent substrate formed with a light shielding material pattern, applying exposure from the rearface of the transparent substrate and development to leave the negative resist layer on the light permeation portion then, etching back the negative resist layer to form a sub-space between the negative resist layer and the light shielding portion and using the negative resist layer as a phase-shifting portion.

In accordance with a second feature of the present invention, there is provided a method of manufacturing a phase-shifting mask having a light shielding portion, a light permeation portion and a phase-shifting portion on a transparent substrate, wherein the method comprises forming a phase-shifting material layer and a negative resist layer on the entire surface of the transparent substrate formed with a light shielding material pattern, applying exposure from the rearface of the transparent substrate and development to leave the negative resist layer on the light permeation portion, etching back the phase-shifting material layer using the negative resist layer as a mask to form a sub-space between phase-shifting material layer and the light shielding portion and using the phase-shifting material layer as the phase-shifting portion.

In accordance with a third feature of the present invention, there is provided a method of manufacturing a phase-shifting mask having a light shielding portion, a light permeation portion and a phase-shifting portion on the transparent substrate, wherein the method comprises forming a negative layer on the entire surface of the transparent substrate formed with the light shielding material pattern, applying exposure from the rearface of the transparent substrate and development to leave the negative resist layer on the light permeation portion, subsequently, etching back the light shielding portion to form a sub-space between the light shielding portion and the negative resist layer and using the negative resist layer as the phase-shifting portion.

In accordance with a fourth feature of the present invention, there is provided a method of manufacturing a phase-shifting mask having a light shielding portion, a light permeation portion and a phase-shifting portion on the transparent substrate, wherein the method comprises forming an inorganic phase-shifting material layer and a negative resist layer on the entire surface of the transparent substrate formed with a light shielding material pattern, applying exposure from the rearface of the transparent substrate and development to leave the negative resist layer on the light permeation portion, etching the phase-shifting material layer by using the negative resist layer as a mask, subsequently, etching back the light shielding portion to form a sub-space between the light shielding portion and the phase-shifting material layer and using the phase-shifting material layer as the phase-shifting portion.

In accordance with a fifth feature of the present invention, there is provided a method of manufacturing a phase-shifting mask having a light shielding portion, a light permeation portion and a phase-shifting portion on the transparent substrate, wherein the method comprises forming a positive resist layer on the entire surface of the transparent substrate formed with a light shielding material pattern and a phase-shifting material layer between the light shielding material pattern, applying exposure from the rearface of the transparent substrate and development to leave the positive resist layer on the light shielding material pattern, subsequently, etching back the positive resist layer, further etching back the light shielding material layer to form a sub-space between the light shielding material layer and the phase-shifting material layer and forming the phase-shifting material layer as the phase-shifting portion.

In accordance with a sixth feature of the present invention, there is provided a met'hod of manufacturing a phase-shifting mask having a light shielding portion, a light permeation portion and a phase-shifting portion on the transparent substrate, wherein the method comprises forming a lower material layer, an intermediate layer and a positive resist layer successively on the entire surface of the transparent substrate formed with a light shielding material pattern and a phase-shifting material layer formed between the light shielding material pattern, applying exposure from the rearface of the transparent substrate phase-shifting portion to leave the positive resist with a gap increased to greater than the gap between the light shielding material pattern above the light shielding material, etching the intermediate layer using the positive resist as a mask, subsequently, etching the lower material layer using the intermediate layer as a mask, further, etching back the light shielding material layer using the intermediate layer and the lower material layer as a mask to form a sub-space between the light shielding material layer and the phase-shift material layer and using the phase-shifting material layer as a phase-shifting portion.

In accordance with a seventh feature of the present invention, there is provided a method of manufacturing a phase-shifting mask having a light shielding portion, a light permeation portion and a phase-shifting portion on the transparent substrate, wherein the method comprises forming an inorganic phase-shifting material layer and a negative resist layer on the entire surface of the transparent substrate formed with a light shielding material pattern, applying exposure from the rearface of the transparent substrate and development to leave the negative resist layer on the light permeation portion, in which exposure is conducted as under exposure while development is conducted as over development to leave the negative resist layer narrowed from the light permeation portion, etching the phase-shifting material layer using the negative resist layer as a mask to form a sub-space between the phase-shifting material layer and the light shielding portion and using the inorganic phase-shifting material layer as the phase-shifting portion.

In accordance with an eighth feature of the present invention, there is provided a method of manufacturing a phase-shifting mask having a light shielding portion, a light permeation portion and a phase-shifting portion on the transparent substrate, wherein the method comprises forming a negative resist layer on the entire surface of the transparent substrate formed with a light shielding material pattern and a phase-shifting material layer between the light shielding material pattern, applying exposure from the rearface of the transparent substrate and development to leave the negative resist on the light permeation portion in which the exposure is conducted as under exposure while the development is conducted as over development to leave the negative resist layer narrowed from the light permeation portion, etching the phase-shifting material layer by using the negative resist layer as a mask to form a sub-space between the phase-shifting material layer and the light shielding portion and using the phase-shifting material layer as the phase-shifting portion.

In accordance with a ninth feature of the present invention, there is provided a method of manufacturing a phase-shifting mask having a light shielding portion, a light permeation portion and a phase-shifting portion on the transparent substrate, wherein the method comprises forming a positive resist layer on the entire surface of the transparent substrate formed with a light shielding material pattern, applying exposure from the rearface of the transparent substrate and development to leave the positive resist layer on the light shielding portion, then depositing a phase-shifting material to the entire surface, subsequently, peeling off the positive resist layer, further etching back either one of the light shielding material or the phase-shifting material layer to form a sub-space between both of them and using the phase-shifting material layer as the phase-shifting portion.

In accordance with a tenth feature of the present invention, there is provided a method of manufacturing a phase-shifting mask having a light shielding portion, a light permeation portion and a phase-shifting portion on a transparent substrate, wherein the method comprises forming a positive resist layer on the entire surface of the transparent substrate formed with a light shielding material pattern, applying exposure from the rearface of the transparent substrate and development to leave the positive resist layer on the light shielding portion, then depositing a phase-shifting material on the entire surface, further, etching back the positive resist layer, subsequently, etching back the light shielding material using the positive resist layer as a mask to form a sub-space between the light shielding material and the phase-shifting material layer deposited on the light permeation portion and using the phase-shifting material layer as the phase-shifting portion.

In accordance with an eleventh feature of the present invention, there is provided a method of manufacturing a phase-shifting mask having a light shielding portion, a light permeation portion and a phase-shifting portion on a transparent substrate, wherein the method comprises forming a positive resist layer on the entire surface of the transparent substrate formed with the light shielding material pattern, applying exposure from the rearface of the transparent substrate and development to leave the positive resist layer on the light shielding portion, then depositing a phase-shifting material on the entire surface, further, forming the positive resist layer to the entire surface, applying exposure from the rearface of the transparent substrate and development to leave the positive resist layer with a gap increased to greater than the gap between the light shielding material above the light shielding material, applying exposure and development to the lower positive resist layer using the upper positive layer as a mask to etch back the lower positive resist layer, and etching back the light shielding material using the lower positive resist layer as a mask to form a sub-space between the light shielding material and the phase-shifting material layer and using the phase-shifting material layer as the phase-shifting portion.

In each of the features of the present invention, the phase-shifting portion means such a portion as allowing an exposure light to transmit at a phase different from each other relative to the exposure light transmitting the light permeation portion. The light shielding portion means such a portion as inhibiting the transmission of light for the exposure light used. The light permeation portion allows the exposure light to be transmitted therethrough. It is desirable that the light shielding portion and the light permeation portion have great light shielding property and light permeating property, respectively, but it is not always necessary that they shut or transmit the light completely but may shut or transmit the light to such an extent as capable of forming a required pattern. It is also desirable that the phase-shifting portion has a large light transmittance like that of the light permeation portion but it may suffice that it can conduct necessary phase inversion and exposure.

As the material for the light shielding portion, chromium, as well as chromium oxide, any of high melting metals (W, Mo, Be, etc.) and oxides thereof can be used.

The light permeation portion may be formed by using a transparent substrate portion not formed with the light shielding portion or the phase-shifting portion as it is and adapted to transmit the light therethrough.

In each of the features of the present invention, the sub-space is also so constituted as to transmit the light like that of the light permeation portion.

As the transparent substrate, there can be mentioned quartz, ordinary glass, glass properly containing various kinds of ingredients or other appropriate materials.

In each of the inventions, the phase-shifting portion can generally be obtained by patterning a material constituting the phase-shifting portion on a substrate or the like. As the material for the phase-shifting portion, the following materials can be used generally, for example, within the scope of the gist of each of the features of the invention.

That is, various kinds of organic materials usable as a photoresist can be used and, for example, EB resist (negative or positive resist) may be used to serve also as a resist function in the EB drawing device.

Alternatively, SiO, $SiO_2$ and silicon nitrides may also be used. Since it may suffice to attain the desired phase-shifting in the phase-shifting portion, the phase-shifting may be caused by doping a substance that changes the refractive index as a pattern to a portion in the light permeation portion (substrate), without forming it on the substrate so long as it is within the scope of the gist of each of the features of the invention.

According to each of features of the present inventions, since the phase-shifting portion is obtained by etching back the phase-shifting material layer or the light shielding material layer to form a sub-space between the phase-shifting material layer and the light shielding portion, the shape such as the width of the phase-shifting portion can be controlled by the etching back conditions. Therefore, according to each of features of the present invention, phase-shifting mask can be formed at a good controllability and with an easy step well known so far.

DESCRIPTION OF THE ACCOMPANYING DRAWINGS

DESCRIPTION OF THE PREFERRED EMBODIMENTS

Description will now be made to preferred embodiments of the present invention but the present invention is not restricted only to the embodiments described below.

EXAMPLE-1

The first feature of the present invention is embodied in this example in a case of manufacturing a phase-shifting mask used upon manufacturing a refined and integrated semiconductor device.

Figure 1A:
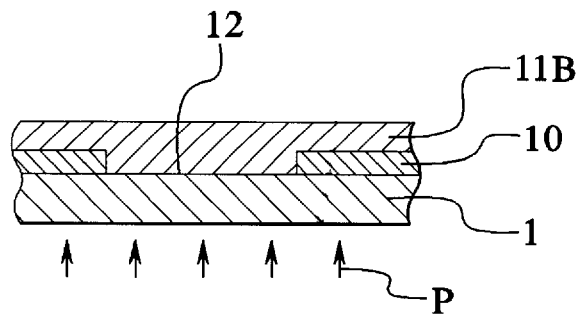
FIG. 1 is a cross sectional view of a mask in each of steps in Example-1.
Figure 1B:
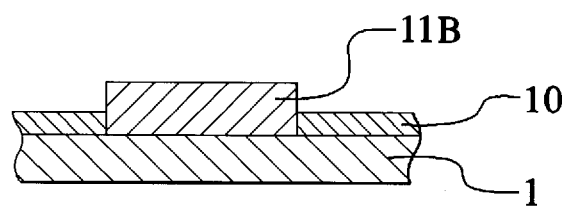
Figure 1C:
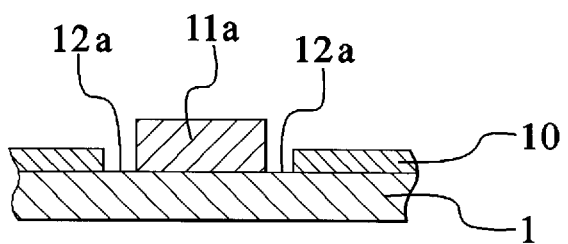

Manufacturing steps in this example comprises forming a negative resist layer 11b on the entire surface of a transparent substrate 1 on which a light shielding material pattern 10 is formed (refer to FIG. 1a), applying exposure from the rearface of the transparent substrate 1 as shown by arrows P, followed by development to leave the negative resist layer 11b on a light permeation portion 12 (refer to FIG. 1b), then reducing the width of the negative resist layer 11b by etching back to form a sub-space 12a between the negative resist layer 11b and the light shielding portion 10 as shown in FIG. 1c and using the thus narrowed negative resist layer 11b as the phase-shifting portion 11a.

More specifically, in this example, the negative resist layer 11b may be retracted or narrowed by etching, either by continuing the development as it is, or applying development with a concentrated liquid developer, or applying plasma etching.

EXAMPLE-2

The second feature of the present invention is embodied in this example.

Figure 2A:
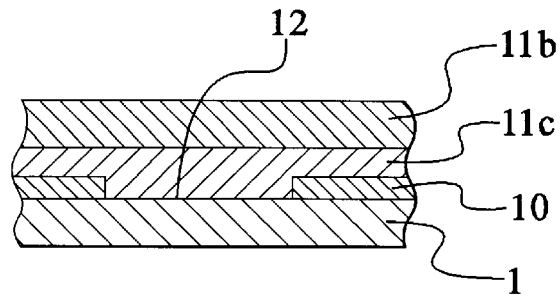
FIG. 2 is a cross sectional view of a mask in each of steps in Example-2.
Figure 2B:
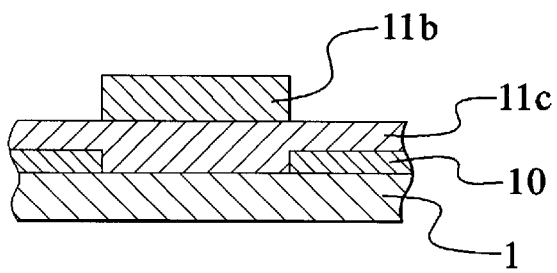
Figure 2C:
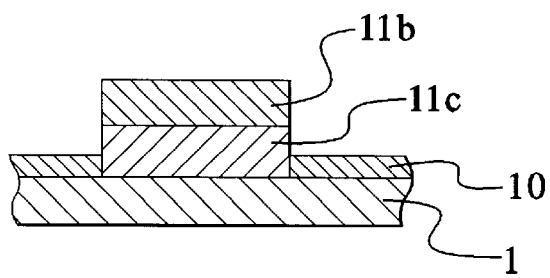

Manufacturing steps in this example comprise laminating a phase-shifting material layer 11c and a negative resist layer 11b successively thereby forming them to the entire surface of a transparent substrate 1 formed with a light shielding material pattern 10 (refer to FIG. 2a), applying exposure from the rearface of the transparent substrate 1, successively applying development to leave the negative resist layer 11b on a light permeation portion 12 (refer to FIG. 2b), etching the phase-shifting material layer 11c using the negative resist layer 11b as a mask (refer to FIG. 2c), further applying over etching to form a sub-space 12a (refer to FIG. 2d), then peeling the resist layer 11b or peeling the resist layer 11b and, subsequently etching back the phase-shifting material layer 10c to form a sub-space 12a between the phase-shifting material layer 11c and the light shielding portion 10, and using the phase-shifting material layer 11c as a phase-shifting portion 11a.

Figure 2D:
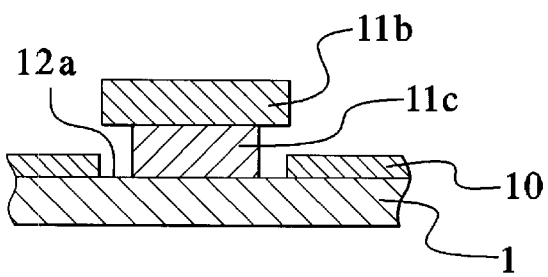
Figure 2E:
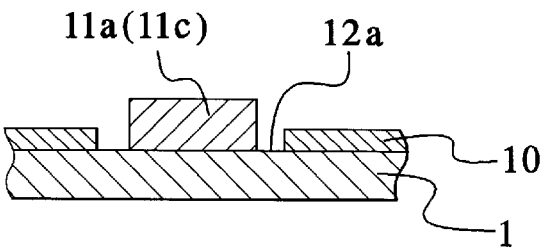

More specifically, in this example, the phase-shifting material may be any of organic and inorganic materials such as SOG (Spin On Glass. Si-containing organic material which is coatable and formed into $SiO_2$ by heating), SiN (silicon nitride) and $SiO_2$. The film thickness of phase-shifting material is defined as $\lambda/2(n-1)$ for attaining a preferred 180° phase inversion. Over etching for the phase-shifting material layer 11c in FIG. 2d is desirably applied as isometric etching by using plasma etching. Further, etching for the phase-shifting material layer 11c after peeling the resist layer 11b in FIG. 2e may be isometric etching either by plasma etching or liquid etching.

EXAMPLE-3

The third feature of the present invention is embodied in this example.

Figure 3A:
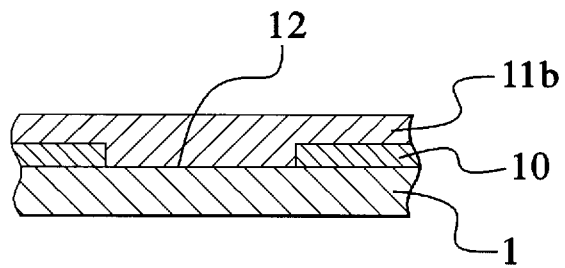
FIG. 3 is a cross sectional view of a mask in each of steps in Example-3.
Figure 3B:
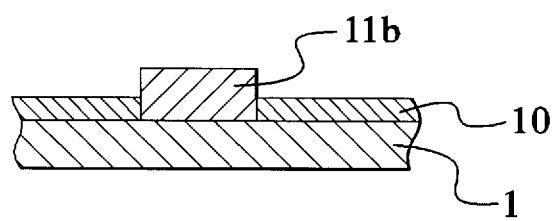
Figure 3C:
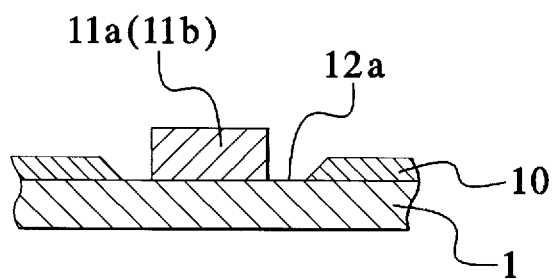

Manufacturing steps in this example comprise forming a negative resist layer 11b over the entire surface of a transparent substrate 1 formed with a light shielding pattern 10 (refer to FIG. 3a), applying exposure from the rearface of the transparent substrate 1, followed by applying development to leave the negative resist layer 11b on a light permeation portion 12 (refer to FIG. 3b), then etching back the light shielding portion 10 to form a sub-space 12a between the light shielding portion 10 and the negative resist layer 11b to form a structure shown in FIG. 3c and using the negative resist layer 11b as the phase-shifting portion 11a.

More specifically, SAL-601 available from Shipley Co in U.S.A. is coated as a negative resist to a thickness of $\lambda/2(n-1)$. Cr is used as the light shielding material and preferably etched back by isometric wet etching.

EXAMPLE-4

The fourth feature of the present invention is embodied in this example.

Figure 4A:
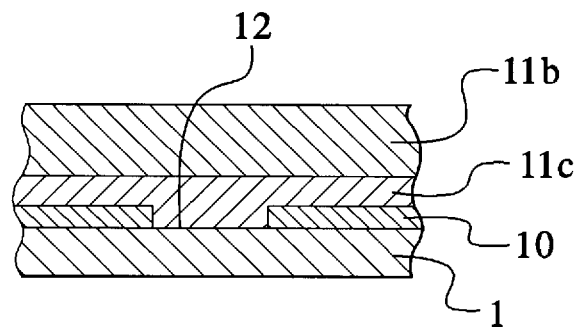
FIG. 4 is a cross sectional view of a mask in each of steps in Example-4.
Figure 4B:
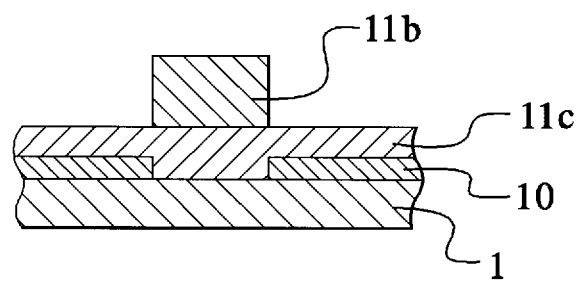
Figure 4C:
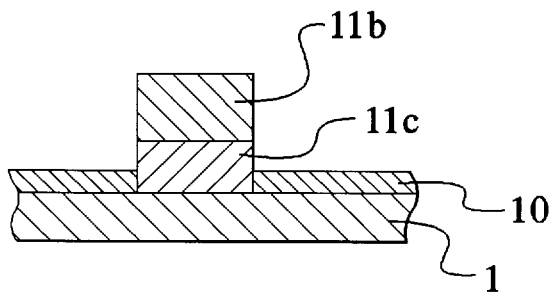
Figure 4D:
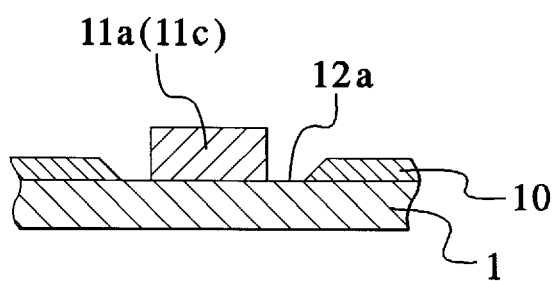

Manufacturing steps in this example comprise forming a phase-shifting material layer 11c and a negative resist material layer 11b successively on a transparent substrate 1 formed with a light shielding material pattern 10 (refer to FIG. 4a), applying exposure from the rearface of the transparent substrate 1, followed by applying development to leave a patterned negative resist layer 11b on a light permeation portion 12 (refer to FIG. 4b), etching the phase-shifting material layer 11c using the negative resist layer 11b as a mask (refer to FIG. 4c), then etching back the light shielding material layer 10 by an appropriate means to form a sub-space 12a between the light shielding material layer 10 and the phase-shifting material layer 11c and using the phase-shifting material layer 11c as a phase-shifting portion 11a (refer to FIG. 4d).

More specifically, inorganic phase-shifting material such as $SiO_2$ or SiN is preferably used as the phase-shifting material.

EXAMPLE-5

The fifth feature of the present invention is embodied in this example.

Figure 5A:
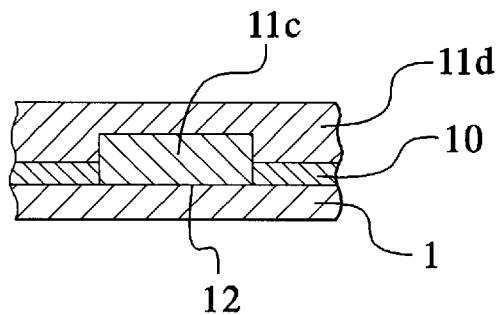
FIG. 5 is a cross sectional view of a mask in each of steps in Example-5.
Figure 5B:
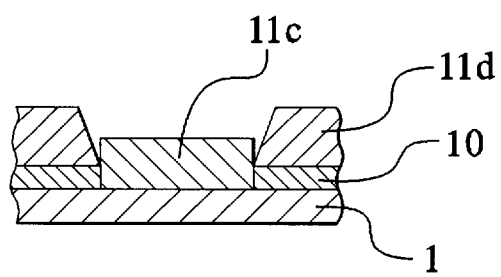
Figure 5C:
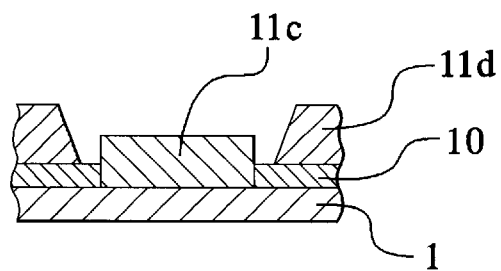
Figure 5D:
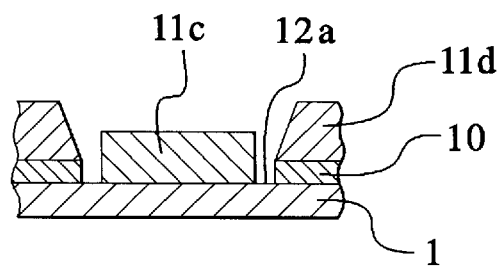
Figure 5E:
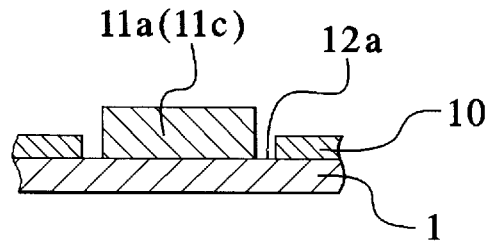

Manufacturing steps in this example comprise forming a positive resist layers 11*d* over the entire surface of a transparent substrate 1 formed with a light shielding material pattern 10 and a phase-shifting material layer 11*c* formed on a light premeation portion 12 between the light shielding material pattern (refer to FIG. 5*a*), applying exposure from the rearface of the transparent substrate 1, followed by applying development to leave the positive resist layer 11*d* on the light shielding material pattern 10 (refer to FIG. 5*b*), then etching back the positive resist layer 11*d* (refer o FIG. 5*c* ), further, etching back the light shielding material layer 10 to form a sub-space between the light shielding material layer 10 and the phase-shifting material 11*c* (refer to FIG. 5*d*), and peeling the positive resist layer 11*d* and using the phase-shifting material layer 11*c* as the phase-shifting portion 11*a* (refer to FIG. 5*e*).

More specifically, a positive resist having a resolution power which is rather low and causing large film reduction, for example, OFPR800 made by Tokyo Ohka Co. is preferred. In the etching back for the positive resist, a further development subsequent to the developing step has an advantage of making the controllability satisfactory, that is, making the accuracy higher since the developing speed is retarded as the resist layer is retracted toward the inside by development, because light is more or less irradiated on the side of the positive resist. However, the positive resist may be retracted by applying isometric etching by a plasma asher. Further, the light shielding material layer can be etched back either by dry etching or wet etching but the former method is preferred.

EXAMPLE-6

The sixth feature of the present invention is embodied in this example.

Figure 6A:
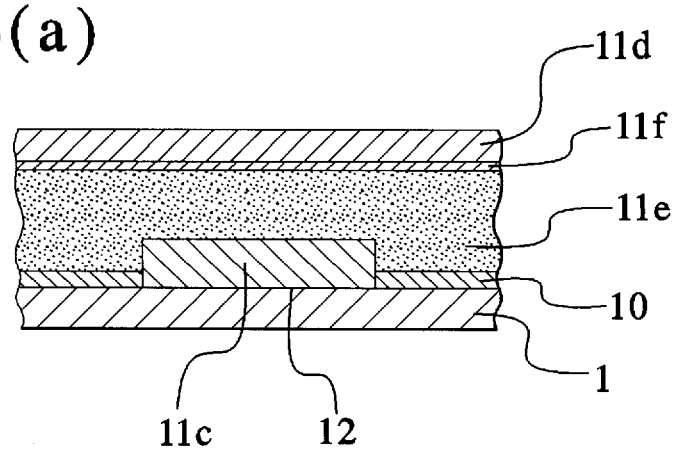
FIG. 6 is a cross sectional view of a mask in each of steps in Example-6.

Manufacturing steps in this example comprise stacking a lower material layer 11*e*, an intermediate layer 11*f* and a positive resist layer 11*d* successively and forming them over the entire surface of a transparent substrate 1 formed with a light shielding material pattern 10 and a phase-shifting material layer 11*c* formed on a light permeation portion 12 between the light shielding material pattern (refer to FIG. 6*a*), applying exposure from the rearface of the transparent substrate 1 as shown by arrows P (refer to FIG. 6*b*), followed by applying development to leave a positive resist 11*d* above the light shielding material 10 with a gap increased to greater than that between the light shielding material pattern (refer to FIG. 6*c*), etching the intermediate layer 11*f* and then a lower material layer 11*e* by using the positive resist 11*d* as a mask (refer to FIG. 6*d*), further, etching back the light shielding material layer 10 using the layers 11*f* and 11*e* as a mask to form a sub-space 12*a* between the light shielding material layer 10 and the phase-shifting material layer 11*c*, peeling off the lower material layer 11*e* and using the phase-shifting material layer 11*c* as the phase-shifting portion 11*a*.

Figure 6B:
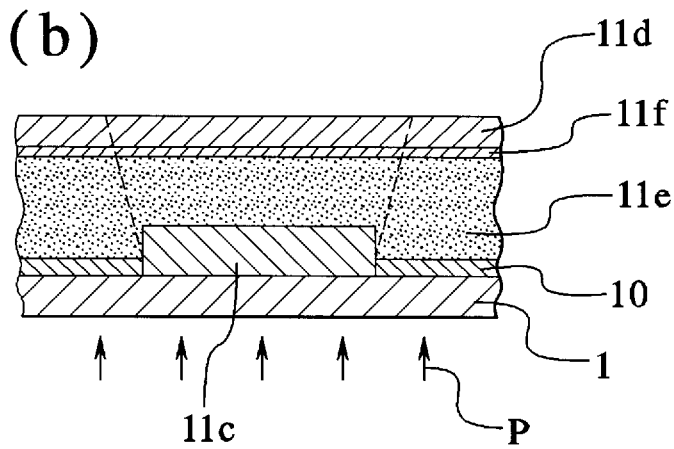
Figure 6C:
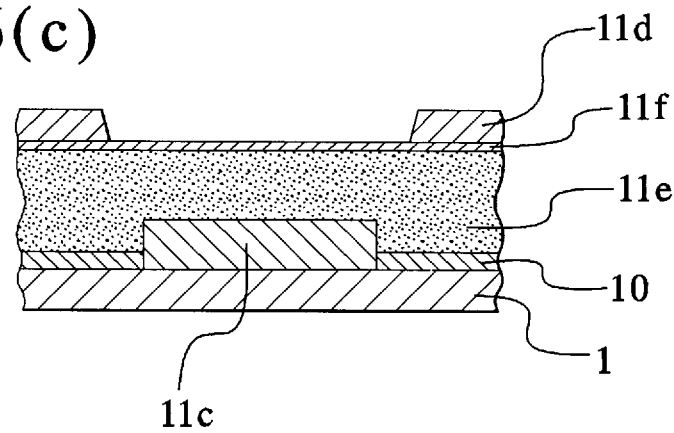
Figure 6D:
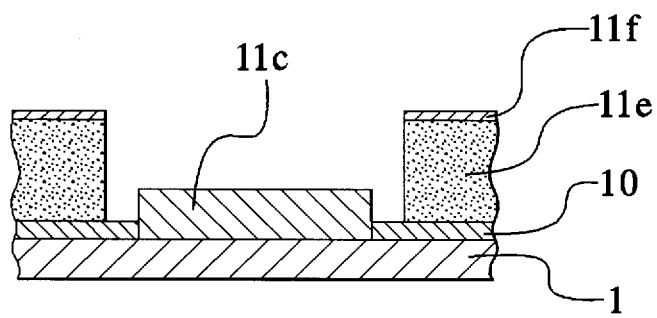
Figure 6E:
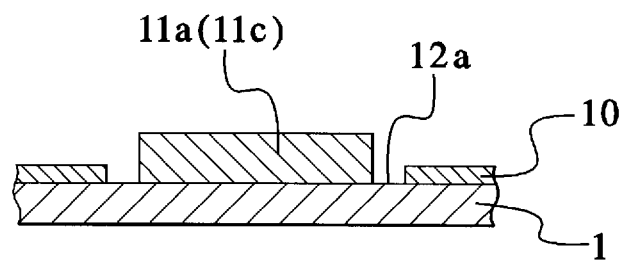

More specifically, there are used PMMA of 2 um thickness as the lower material layer, SOG of 100 Å thickness as the intermediate layer and OFPR800 of 0.5 um thickness as the positive resist. g-rays are used as the light for irradiation from the rearface and exposure is diverged by the diffraction of light as shown by the dotted line in FIG. 6*b*. Since the width is widened more as the thickness of the lower material layer and the intermediate layer is greater and the wavelength for the exposure is longer, control can be attained by properly selecting them including the kinds of the materials for each of the layers. Further, upon etching the intermediate layer and the lower material layer, the lower material layer can be put to plasma etching or RIE etching and, at the same time, the positive resist layer can also be eliminated by patterning $SiO_2$ and using $SiO_2$ as a mask.

EXAMPLE-7

The seventh feature of the present invention is embodied in this example.

Figure 7A:
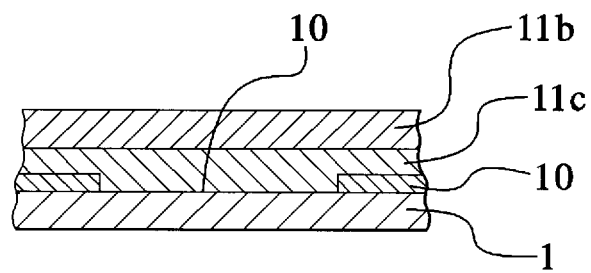
FIG. 7 is a cross sectional view of a mask in each of steps in Example-7.
Figure 7B:
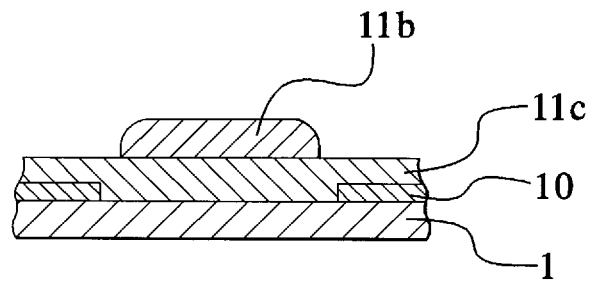
Figure 7C:
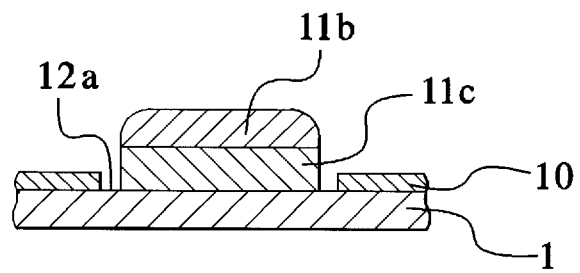
Figure 7D:
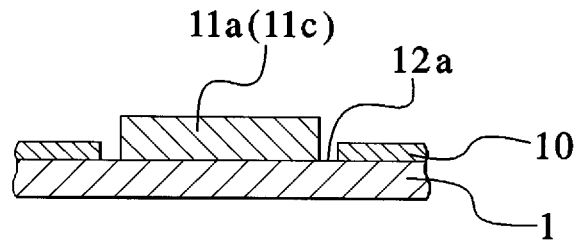

Manufacturing steps in this example comprise forming an inorganic phase-shifting material layer 11*c* and a negative resist layer 11*b* on a transparent substrate formed with a light shielding material pattern 10 (refer to FIG. 7*a*), applying exposure from the rearface of the transparent substrate 1, followed by applying development to leave the negative resist layer 11*b* on a light permeation portion 12, in which exposure is applied as under exposure while development is applied as over development to leave the negative resist layer 11*b* with the width being decreased to less than that of the light permeation portion 12 (refer to FIG. 7*b*), etching the phase-shifting material layer 11*c* by using the negative resist layer 11*b* as a mask to form a sub-space 12*a* between the phase-shifting material layer 11*c* and the light shielding portion 10 (refer to FIG. 7*c*), peeling of the negative resist layer 11*b* and using the inorganic phase-shifting material layer 11*c* as a phase-shifting portion 11*a* as shown in FIG. 7*d*.

More specifically, SAL-601 is used as the negative resist and exposure is applied as under exposure while the development is applied as over development thereby controlling the width of the negative resist and, thus, controlling the width of the sub-space.

EXAMPLE-8

The eighth feature of the present invention is embodied in this example.

Figure 8A:
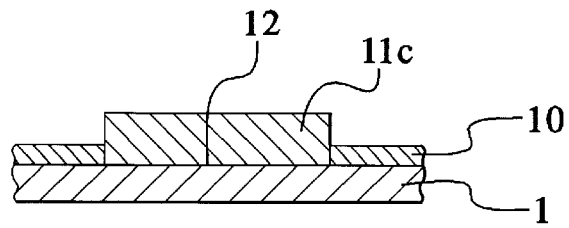
FIG. 8 is a cross sectional view of a mask in each of steps in Example-8.
Figure 8B:
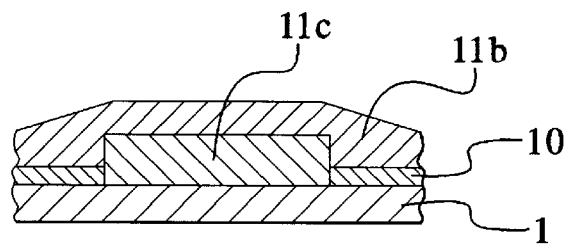
Figure 8C:
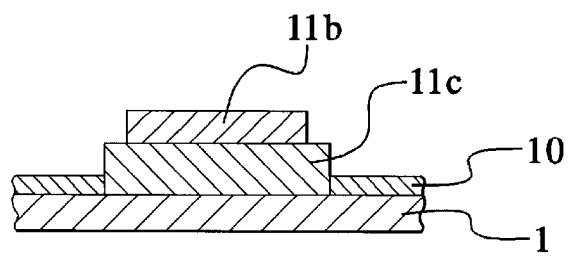
Figure 8D:
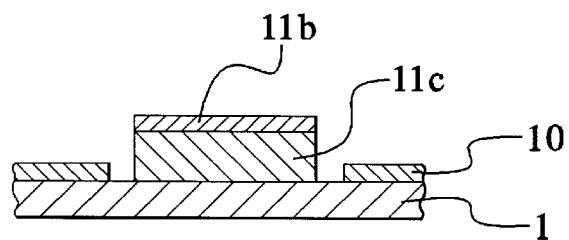
Figure 8E:
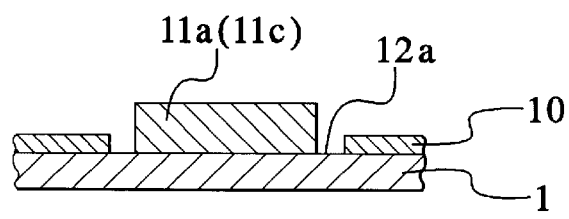

Manufacturing steps in this example comprise forming a negative resist layer 11*b* over the entire surface of a transparent substrate 1 formed with a light shielding material pattern 10 and a phase-shifting material layer 11*c* on the light permeation portion 12 between the light shielding material pattern (refer to FIG. 8*b*), applying exposure from the rearface of the transparent substrate 1, followed by applying development to leave the negative resist layer 11*b* on the light permeation portion 12 in which the exposure is applied as under exposure while development is applied as over development to leave the negative resist layer 11*b* with a width being reduced to less than that of the light permeation portion 12 (refer to FIG. 8*c*), etching the phase-shifting material layer 11*c* by using the negative resist layer 11*b* as a mask to form a sub-space 12*a* between the phase-shifting material layer 11*c* and the light shielding portion 10, peeling off the negative resist layer 11*b* and using the phase-shifting material layer 11*c* as the phase-shifting portion 11*a*.

EXAMPLE-9

The ninth feature of the present invention is embodied in this example.

Figure 9A:
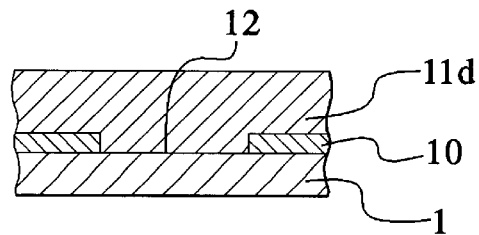
FIG. 9 is a cross sectional view of a mask in each of steps in Example-9.
Figure 9B:
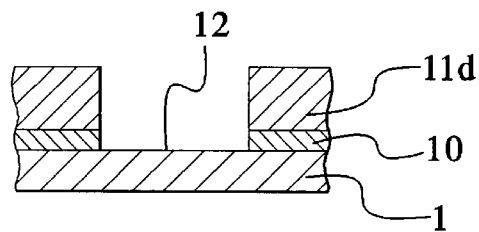
Figure 9C:
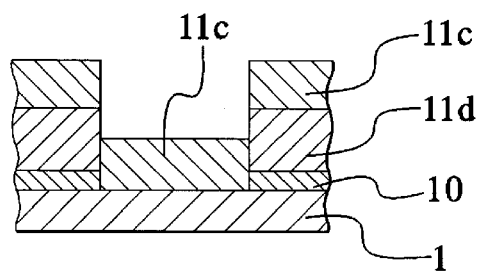
Figure 9D:
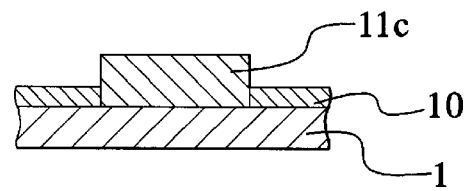
Figure 9E:
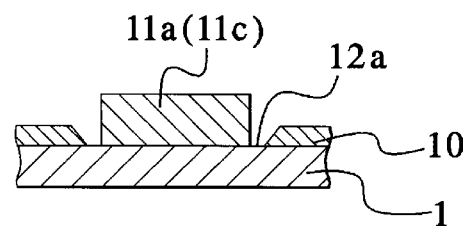
Figure 9F:
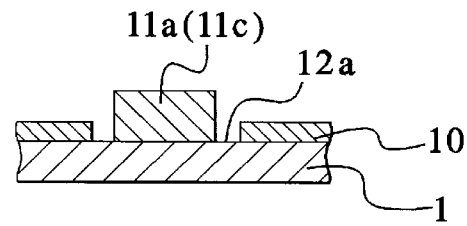

Manufacturing steps in this example comprise forming a positive resist layer 11*d* over the entire surface of a transparent substrate 1 formed with a light shielding material pattern 1 (refer to FIG. 9*a*), applying exposure from the rearface of the transparent substrate 1, followed by applying development to leave the positive resist layer 11*d* on light shielding portion 10 (refer to FIG. 9*b*), then depositing a phase-shifting material layer 11*c* on the entire surface (refer to FIG. 9c), subsequently, peeling off the positive resist layer 11d to leave the phase-shifting material layer 11c on the light permeation portion 12 (refer to FIG. 9d), further, etching the light shielding material 10 (refer to FIG. 7e) or etching the phase-shifting material 11c (refer to FIG. 9f), to form a sub-space 12a between the light shielding material 10 and the phase-shifting material layer 11c, and using the phase-shifting material 11c as the phase-shifting portion 11a.

More specifically, when TSMR-V3 manufactured by Tokyo Ohka Co. is used and formed to a thickness of 1 um as a positive resist and when the thickness of to 800 Å for the light shielding material is adopted generally, while maintaining the mask accuracy, a joining between the phase-shifting layer above the light permeation portion and the phase-shifting material layer above the light shielding portion can be prevented by depositing the phase-shifting material layer by means of vapor deposition or the like. This makes it possible to rapidly and easily form a phase-shifter by the lift-off of the positive resist layer.

EXAMPLE-10

The tenth feature of the present invention is embodied in this example.

Figure 10A:
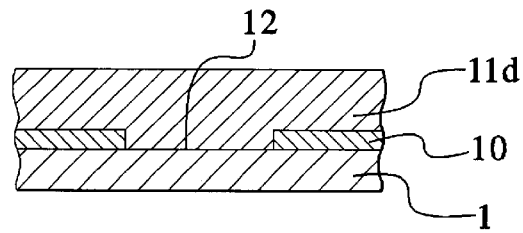
FIG. 10 is a cross sectional view of a mask in each of steps in Example-10.
Figure 10B:
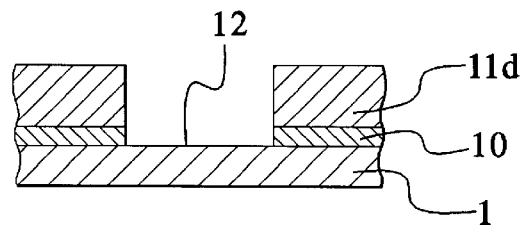
Figure 10C:
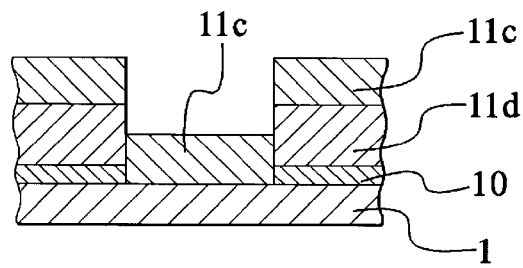
Figure 10D:
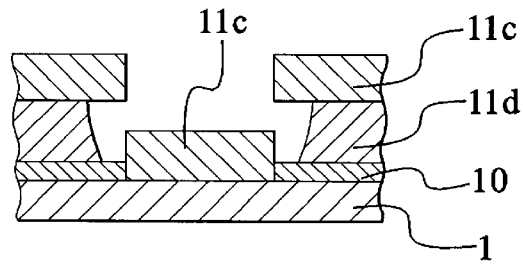
Figure 10E:
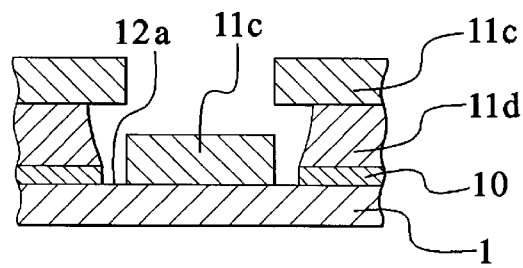
Figure 10F:
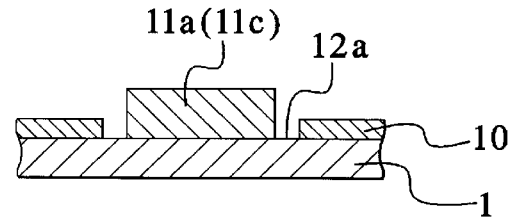

Manufacturing steps in this example comprise forming a positive resist layer 11d over the entire surface of a transparent substrate 1 formed with a light shielding material pattern 10 (refer to FIG. 10a), applying exposure from the rearface of the transparent substrate 1, followed by applying development to leave the positive resist layer 11d on the light shielding pattern 10 (refer to FIG. 10b), depositing the phase-shifting material 11c over the entire surface (refer to FIG. 10c), further etching back the resist layer 11d to expose a portion of the material 10 (FIG. 10d), the etching the light shielding material 10 by using the positive resist layer 11d as a mask to form a sub-space 12a between the light shielding portion 10 and the phase-shifting material layer 11c previously deposited on the light permeation portion 12 (refer to FIG. 10e), successively, lifting off the positive resist layer 11d and using the phase-shifting material layer 11c as the phase-shifting portion 11a as shown in FIG. 10f.

More specifically, retraction of the photoresist layer can be executed by optionally selecting methods such as applying over development, applying exposure from the surface and then applying development, applying development with a concentrated liquid developer, or applying isometric plasma etching by $O_2$ plasma. The isometric etching with $O_2$ plasma can be said to be a satisfactory method since this can be conducted continuously with the isometric etching step for the light shielding material in the next step. Then, since the light shielding material is etched back by using the photoresist layer as a mask and then it is eliminated by lifting off the photoresist layer, not only a sufficient light shielding property can be ensured with no film reduction in the light shielding portion after the formation of the sub-space, but also the etching back accuracy for the light shielding material can be improved.

EXAMPLE-11

The eleventh feature of the present invention is embodied in this example.

Figure 11A:
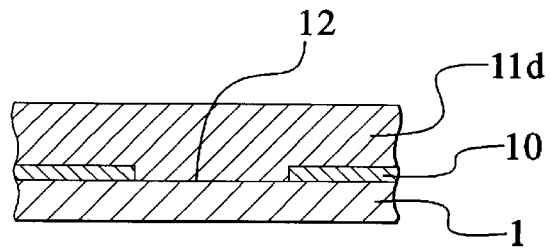
FIG. 11 is a cross sectional view of a mask in each of steps in Example-11.

Manufacturing steps in this example comprise forming a positive resist layer 11d over the entire surface of a transparent substrate 1 formed with a light shielding pattern 10 (refer to FIG. 11a), applying exposure from the rearface of a transparent substrate 1, followed by applying development to leave the positive resist layer 11d on the light shielding portion 10 (refer to FIG. 11b), then a depositing phase-shifting material 11c over the entire surface (refer to FIG. 11c), applying, another positive resist layer 11d' to the entire surface thereon (refer to FIG. 11d), applying exposure from the rearface of the transparent substrate 1, followed by development to leave the positive resist layer 11d' retracted from the end face of the light shielding material 10, with a gap being increased to greater than that between the light shielding material pattern 10 above the light shielding material 10 (refer to FIG. 11e), applying exposure to the lower positive resist layer 11d using the upper positive resist layer 11d' as a mask, followed by development to retract the lower positive resist layer 11d (refer to FIG. 11f), etching back the light shielding material 10 by using the lower positive resist layer 11d as a mask to form a sub-space 12a between the light shielding material 10 and the phase-shifting material layer 11c on the light permeation portion 12 (refer to FIG. 11g), and subsequently, eliminating the positive resist layer 11d and using the phase-shifting material layer 11c on the light permeation portion 12 as the phase-shifting portion 11a.

Figure 11B:
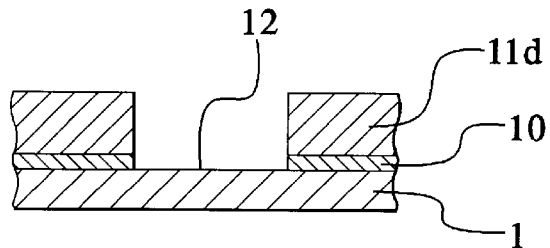
Figure 11C:
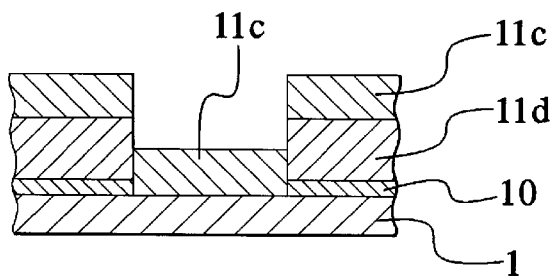
Figure 11D:
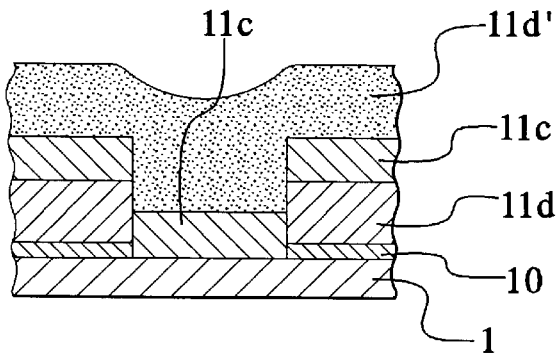
Figure 11E:
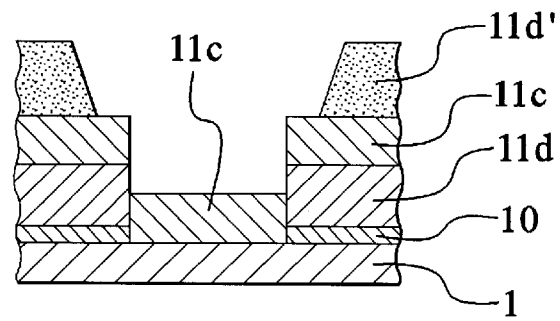
Figure 11F:
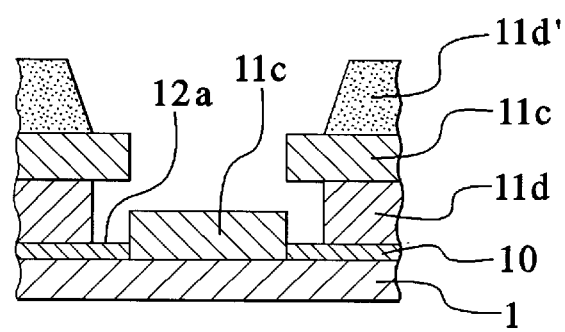
Figure 11G:
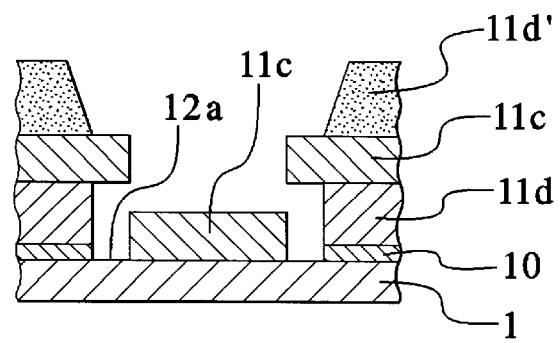
Figure 11H:
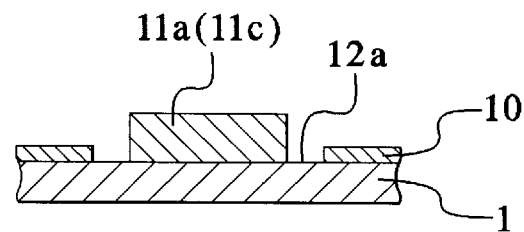
Figure 12A:
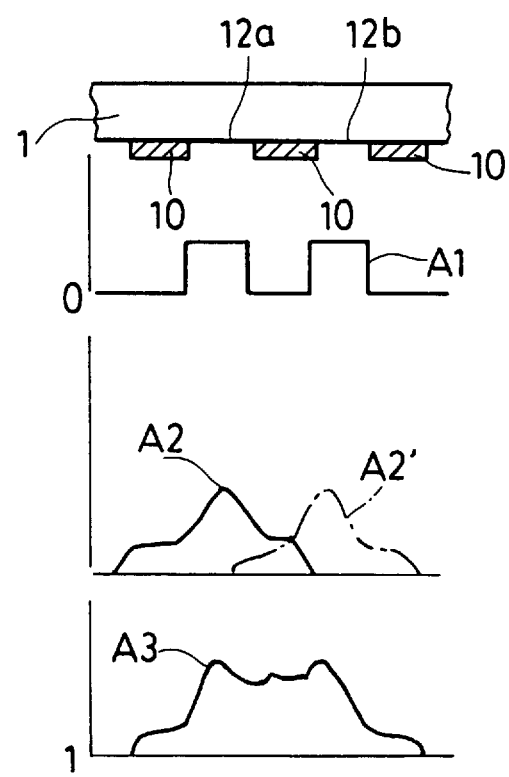
FIG. 12 is an explanatory view for the principle of a phase-shifting mask.
Figure 12B:
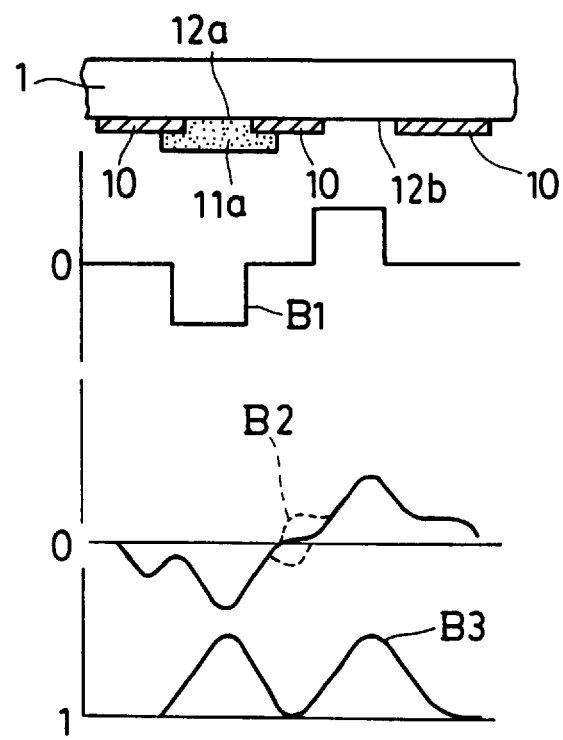
Figure 13A:
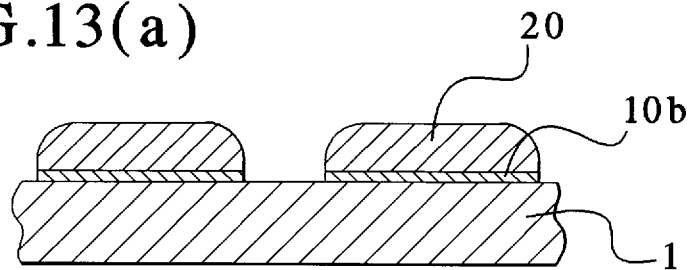
FIG. 13 is a cross sectional view of a mask in each of the steps in the prior art.
Figure 13B:
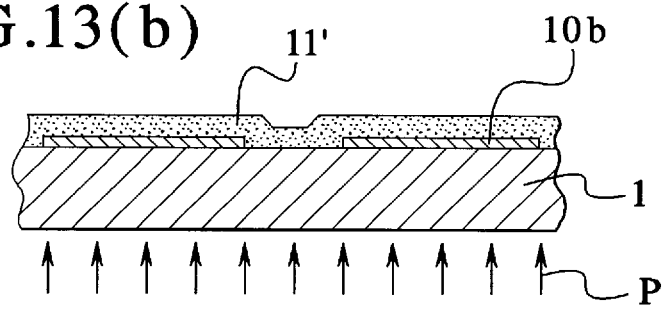
Figure 13C:
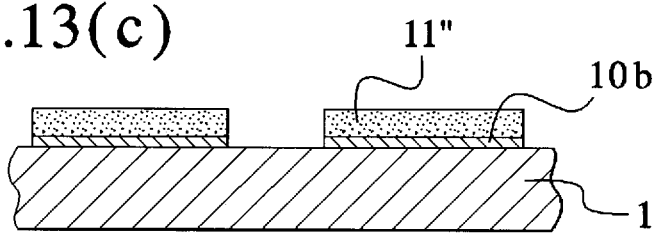
Figure 13D:
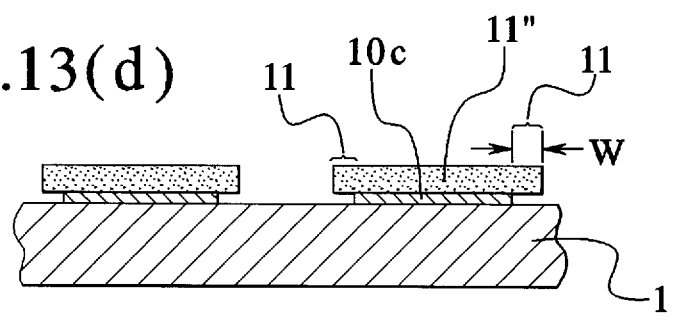

More specifically, PMMA is used as the lower positive resist layer coated at first and deep UV-rays are exposed from the rearface of the transparent substrate and then development is applied to obtain a structure shown in FIG. 11b. As the upper positive resist layer, use of OFPR-800 with a large film reduction is advantageous for forming the upper positive resist layer retracted by exposure and development from the rearface of the transparent substrate in the succeeding step. Then, when a light of long wavelength, for example, g-rays are used for the exposure from the rearface, the upper positive resist layer can be retracted greatly after the development due to the effect of the diffraction of light. Further, as a light source for etching back the lower positive resist layer, deep UV-rays are preferred.

As has been described above in the first to third features of the present invention, a phase-shifting mask can be manufactured in a self aligned manner simply and easily at a high accuracy, free from problem for the mask alignment accuracy between each other. Further, according to the fourth to eighth features of the present invention, the film reduction of the light shielding material upon preparing the phase-shifting portion can be prevented effectively by the use of the resist mask, to completely prevent the light transmissions through the light shielding portion, no film reduction is caused to the phase shifter, and etching accuracy can be improved by using the dry etching. According to ninth to eleventh feature of the present invention, since the phase-shifting mask is prepared by lifting off the positive resist, the etching accuracy for the light shielding material can be improved, the film reduction can be prevented and it is also effective in a case where selection ratio with respect to the substrate on the photomask can not be taken on the photomask or in a case where the etching damage is increased. That is, by the method of manufacturing the phase-shifting mask according to each of the features of the present invention, a self-aligned phase-shifting mask formed between the light shielding material pattern independent of the light shielding portion can be formed at a good controllability in an easy step.

What is claimed is:

1. A method of manufacturing a phase-shifting mask having a light shielding portion, a light permeation portion and a phase-shifting portion on a transparent substrate, wherein the method comprises:

forming a negative resist layer over the entire surface of the transparent substrate formed with a light shielding material pattern, applying exposure through the rearface of the transparent substrate and development to leave the negative resist layer on the light permeation portion, etching back said negative resist layer to form a sub-space between the negative resist layer and the light shielding portion and using said negative resist layer as a phase-shifting portion.

2. A method of manufacturing a phase-shifting mask having a light shielding portion, a light permeation portion and a phase-shifting portion on a transparent substrate, wherein the method comprises:

forming a phase-shifting material layer and a negative resist layer over the entire surface of the transparent substrate formed with a light shielding material pattern, applying exposure through the rearface of the transparent substrate and development to leave the negative resist layer on the light permeation portion, etching back the phase-shifting material layer using the negative resist layer as a mask to form a sub-space between phase-shifting material layer and the light shielding portion and using the phase-shifting material layer as the phase-shifting portion.

3. A method of manufacturing a phase-shifting mask having a light shielding portion, a light permeation portion and a phase-shifting portion on the transparent substrate, wherein the method comprises:

forming a negative resist layer over the entire surface of the transparent substrate formed with the light shielding material pattern, applying exposure through the rearface of the transparent substrate and development to leave the negative resist layer on the light permeation portion, etching back the light shielding portion to form a sub-space between the light shielding portion and the negative resist layer and using said negative resist layer as the phase-shifting portion.

4. A method of manufacturing a phase-shifting mask having a light shielding portion, a light permeation portion and a phase-shifting portion on the transparent substrate, wherein the method comprises:

forming an inorganic phase-shifting material layer and a negative resist layer on the entire surface of the transparent substrate formed with a light shielding material pattern, applying exposure through the rearface of the transparent substrate and development to leave the negative resist layer on the light permeation portion, etching the phase-shifting material layer by using said negative resist layer as a mask, etching back the light shielding portion to form a sub-space between the light shielding portion and the phase-shifting material layer and using said phase-shifting material layer as the phase-shifting portion.

5. A method of manufacturing a phase-shifting mask having a light shielding portion, a light permeation portion and a phase-shifting portion on the transparent substrate, wherein the method comprises:

forming a positive resist layer over the entire surface of the transparent substrate formed with a light shielding material pattern and a phase-shifting material layer between said light shielding material pattern, applying exposure through the rearface of the transparent substrate and development to leave the positive resist layer on the light shielding material pattern, etching back said positive resist layer, further etching back the light shielding material layer to form a sub-space between the light shielding material layer and the phase-shifting material layer and using the phase-shifting material layer as the phase-shifting portion.

6. A method of manufacturing a phase-shifting mask having a light shielding portion, a light permeation portion and a phase-shifting portion on the transparent substrate, wherein the method comprises:

forming a combination of a lower material layer, an intermediate layer and a positive resist layer successively on the entire surface of the transparent substrate formed with a light shielding material pattern and a phase-shifting material layer formed between said light shielding material pattern, applying exposure through the rearface of the transparent substrate and development to leave the positive resist with a gap increased to greater than that between said light shielding material pattern above the light shielding material, etching the intermediate layer using the positive resist as a mask, etching the lower material layer using the intermediate layer as a mask, further etching back the light shielding material layer using the intermediate layer and the lower material layer as a mask to form a sub-space between the light shielding material layer and the phase-shift material layer and using the phase-shifting material layer as a phase-shifting portion.

7. A method of manufacturing a phase-shifting mask having a light shielding portion, a light permeation portion and a phase-shifting portion on the transparent substrate, wherein the method comprises:

forming an inorganic phase-shifting material layer and a negative resist layer on the entire surface of the transparent substrate formed with a light shielding material pattern, applying an exposure through the rearface of the transparent substrate and a development to leave the negative resist layer on the light permeation portion, in which the exposure is conducted as an under exposure while the development is conducted as an over development to leave the negative resist layer narrower than the light permeation portion, etching the phase-shifting material layer using said negative resist layer as a mask to form a sub-space between the phase-shifting material layer and the light shielding portion and using the inorganic phase-shifting material layer as the phase-shifting portion.

8. A method of manufacturing a phase-shifting mask having a light shielding portion, a light permeation portion and a phase-shifting portion on the transparent substrate, wherein the method comprises:

forming a negative resist layer on the entire surface of the transparent substrate formed with a light shielding material pattern and a phase-shifting material layer between the light shielding material pattern, applying an exposure through the rearface of the transparent substrate and a development to leave the negative resist on the light permeation portion in which the exposure is conducted as an under exposure while the development is conducted as an over development to leave the negative resist layer narrower than the light permeation portion, etching the phase-shifting material layer by using said negative resist layer as a mask to form a sub-space between the phase-shifting material layer and the light shielding portion and using the phase-shifting material layer as the phase-shifting portion.

9. A method of manufacturing a phase-shifting mask having a light shielding portion, a light permeation portion and a phase-shifting portion on the transparent substrate, wherein the method comprises:

forming a positive resist layer over the entire surface of the transparent substrate formed with a light shielding material pattern, applying exposure through the rearface of the transparent substrate and development to leave the positive resist layer on the light shielding portion, depositing a phase-shifting material over the entire surface, peeling off the positive resist layer, further etching back either one of the light shielding material and the phase-shifting material layer to form a sub-space therebetween and using said phase-shifting material layer as the phase-shifting portion.

10. A method of manufacturing a phase-shifting mask having a light shielding portion, a light permeation portion and a phase-shifting portion on a transparent substrate, wherein the method comprises:

forming a positive resist layer over the entire surface of the transparent substrate formed with a light shielding material pattern, applying an exposure through the rearface of the transparent substrate and a development to leave the positive resist layer on the light shielding portion, depositing a phase-shifting material over the entire surface, etching back the positive resist layer to expose portions of the light shielding material, etching back the exposed portions of the light shielding material using said positive resist layer as a mask to form a sub-space between the light shielding material and the phase-shifting material layer deposited on the light permeation portion and using said phase-shifting material layer as the phase-shifting portion.

11. A method of manufacturing a phase-shifting mask having a light shielding portion, a light permeation portion and a phase-shifting portion on a transparent substrate, wherein the method comprises:

forming a first positive resist layer over the entire surface of the transparent substrate formed with the light shielding material pattern, applying an exposure through the rearface of the transparent substrate and a development to leave a lower positive resist layer on the light shielding portion, depositing a phase-shifting material on the entire surface, forming a second positive resist layer over the entire surface, applying an exposure through the rearface of the transparent substrate and a development to leave an upper positive resist layer with a second gap increased to greater than the gap between the light shielding material, applying another exposure and development to the lower positive resist layer using the upper positive resist layer as a mask to etch back the lower positive resist layer, and etching back the light shielding material using said lower positive resist layer as a mask to form a sub-space between the light shielding material and the phase-shifting material layer and using said phase-shifting material layer as the phase-shifting portion.

* * * * *